United States Patent
Bondar et al.

(10) Patent No.: US 11,486,733 B2
(45) Date of Patent: Nov. 1, 2022

(54) INTEGRATED ROTATION-ANGLE SENSOR UNIT IN A MEASURING SYSTEM FOR ROTATION ANGLE DETERMINATION

(71) Applicant: TDK-Micronas GmbH, Freiburg (DE)

(72) Inventors: Yan Bondar, Waldkirch (DE); Marcus Christian Meyer, Malsch (DE); Hans Christian Paul Dittmann, Pforzheim (DE)

(73) Assignee: TDK-Micronas GmbH, Freiburg (DE)

( * ) Notice: Subject to any disclaimer, the term of this patent is extended or adjusted under 35 U.S.C. 154(b) by 111 days.

(21) Appl. No.: 17/001,630

(22) Filed: Aug. 24, 2020

(65) Prior Publication Data
US 2021/0055132 A1  Feb. 25, 2021

(30) Foreign Application Priority Data

Aug. 22, 2019  (DE) ..................... 10 2019 005 876.3

(51) Int. Cl.
| | | |
|---|---|---|
| G01D 5/14 | (2006.01) | |
| H01L 43/06 | (2006.01) | |
| H01L 43/04 | (2006.01) | |
| G01P 3/487 | (2006.01) | |

(52) U.S. Cl.
CPC .............. *G01D 5/145* (2013.01); *G01P 3/487* (2013.01); *H01L 43/04* (2013.01); *H01L 43/06* (2013.01)

(58) Field of Classification Search
CPC ............... H05K 1/00; H05K 3/00; G01C 1/00
See application file for complete search history.

(56) References Cited

U.S. PATENT DOCUMENTS

| | | | |
|---|---|---|---|
| 9,000,763 B2 | 4/2015 | Ausserlechner | |
| 9,470,552 B2 | 10/2016 | Ausserlechner | |
| 9,513,344 B2 | 12/2016 | Ausserlechner | |
| 9,625,276 B2 | 4/2017 | Ausserlechner | |
| 9,910,088 B2* | 3/2018 | Milano | ............ G01R 31/2884 |
| 2007/0200564 A1 | 8/2007 | Motz et al. | |
| 2007/0281824 A1 | 12/2007 | Tezuka et al. | |
| 2008/0074102 A1* | 3/2008 | Kitanaka | ............... G01D 5/145 |
| | | | 324/207.2 |

(Continued)

FOREIGN PATENT DOCUMENTS

| | | |
|---|---|---|
| DE | 10 2006 000 037 A1 | 8/2006 |
| DE | 10 2007 025 353 A1 | 12/2007 |

(Continued)

*Primary Examiner* — Jermele M Hollington
*Assistant Examiner* — Temilade S Rhodes-Vivour
(74) *Attorney, Agent, or Firm* — Muncy, Geissler, Olds & Lowe, P.C.

(57) ABSTRACT

An integrated rotation-angle sensor unit in a measuring system for rotation angle determination, with a shaft that is rotatable about an axis of rotation with a transmitter, The sensor unit has a semiconductor layer with a top surface that can be arranged perpendicular to the axis of rotation and has a bottom surface, and two monolithic Hall sensor systems are implemented in the semiconductor layer. Each Hall sensor system has at least a first Hall sensor, a second Hall sensor, and a third Hall sensor, and the three Hall sensors of the first Hall sensor system are arranged on a first circle that is parallel to the top surface of the semiconductor layer and can be arranged concentrically around the axis of rotation.

18 Claims, 2 Drawing Sheets

(56) References Cited

U.S. PATENT DOCUMENTS

| | | | |
|---|---|---|---|
| 2008/0094058 A1* | 4/2008 | Kawashima | G01D 5/145 324/207.25 |
| 2008/0135959 A1* | 6/2008 | Theuss | H01L 43/14 257/E43.001 |
| 2013/0342195 A1* | 12/2013 | Ausserlechner | G01R 33/07 257/427 |
| 2014/0084912 A1* | 3/2014 | van Vroonhoven | G01R 33/07 324/251 |
| 2019/0195657 A1 | 6/2019 | Bilbao de Mendizabal et al. | |
| 2019/0250222 A1 | 8/2019 | Friedrich et al. | |

FOREIGN PATENT DOCUMENTS

| | | |
|---|---|---|
| DE | 10 2012 203 001 A1 | 8/2012 |
| DE | 10 2015 101 635 A1 | 8/2015 |
| EP | 3 502 628 A1 | 6/2019 |
| JP | 6438176 B1 | 11/2018 |

\* cited by examiner

INTEGRATED ROTATION-ANGLE SENSOR UNIT IN A MEASURING SYSTEM FOR ROTATION ANGLE DETERMINATION

This nonprovisional application claims priority under 35 U.S.C. § 119(a) to German Patent Application No. 10 2019 005 876.3, which was filed in Germany on Aug. 22, 2019, and which is herein incorporated by reference.

BACKGROUND OF THE INVENTION

Field of the Invention

The present invention relates to an integrated rotation-angle sensor unit in a measuring system for rotation angle determination.

Description of the Background Art

Integrated rotation-angle sensor units are known, in particular from applications in the automotive field. In this context, the position of a shaft is determined from the measurement of the magnetic flux by means of magnetic field sensors, for example.

SUMMARY OF THE INVENTION

It is therefore an object of the present invention to provide an integrated rotation-angle sensor unit in a measuring system for rotation angle determination that advances the state of the art and, in particular, to provide an especially fault-tolerant and simple and economical alternative.

In an exemplary embodiment of the invention, an integrated rotation-angle sensor unit in a measuring system for rotation angle determination is provided. In addition to the integrated rotation-angle sensor unit, the measuring system includes a shaft that is rotatable about an axis of rotation, wherein a transmitter is arranged on the shaft.

In general, the transmitter is implemented as a permanent magnet, and can be arranged on the end face of the shaft.

The rotation-angle sensor unit can have a semiconductor layer with a top surface that can be arranged perpendicular to the axis of rotation and has a bottom surface.

Formed in the semiconductor layer are a monolithically formed first Hall sensor system and a monolithically formed second Hall sensor system.

Each Hall sensor system respectively can have at least a first Hall sensor, a second Hall sensor, and a third Hall sensor.

The three Hall sensors of the first Hall sensor system can be arranged on a first circle that is parallel to the top surface of the semiconductor layer and is arranged concentrically around the axis of rotation.

The three Hall sensors of the second Hall sensor system can be arranged on a second circle parallel to the top surface of the semiconductor layer and concentrically arranged around the axis of rotation.

The first Hall sensor system can be designed to be redundant to the second Hall sensor system. In addition, it should be noted that the second circle is arranged to be concentric to the first circle. Preferably, a control unit and an analysis unit are arranged within the semiconductor layer. Preferably, all sensors of the rotation-angle sensor unit are in an operative electrical connection with the control and analysis unit.

The control and analysis unit can include a monolithically integrated processor unit. Preferably, the semiconductor layer is implemented as a silicon semiconductor wafer.

It is a matter of course that the term "integrated rotation-angle sensor unit" can include at least one Hall sensor system monolithically integrated into a semiconductor layer and a control and analysis unit monolithically integrated into the same semiconductor layer. If additional components, in particular sensors for measuring mechanical stresses and/or additional types of magnetic field sensors, are provided as part of the rotation-angle sensor unit, the additional components are arranged inside the common IC package.

By designing the three Hall sensors to be spaced apart along the relevant circular line in the two sensor systems, a high resolution in rotation angle determination is achieved. Furthermore, it is possible to compensate for static interfering fields, in particular, as for example the earth's magnetic field, by means of a differential analysis.

Especially for applications in safety-related areas, as for example in the determination of angles of rotation for a steering wheel in a motor vehicle, a redundant design is mandatory.

Another advantage is that each of the Hall sensor systems determines the same components of the magnetic field produced by the transmitter in the same way.

It is a matter of course that the center point of the first circle can be pierced by an imaginary extension of the axis of rotation.

Preferably, the center point of the first circle coincides with the center point of the second circle. In one embodiment, the second circle has a larger radius or a larger diameter than the first circle. In another embodiment, the second circle surrounds the first circle.

The first circle and the second circle can have the same diameter. In other words, the Hall sensors of the first Hall sensor system and the Hall sensors of the second Hall sensor system are implemented on the same circle. In this case, the Hall sensors of the first Hall sensor system are rotated or offset along the circular line relative to the relevant Hall sensors of the second Hall sensor system. It is a matter of course that the size of the rotation is chosen to be small.

The rotation-angle measuring unit can have, implemented on the top surface of the semiconductor layer, a magnetoresistive sensor unit with a first magnetoresistive sensor and a second magnetoresistive sensor.

The magnetoresistive sensors can be implemented as TMR or GMR or AMR sensors. It is a matter of course that the magnetoresistive sensors each have four sensor subelements, preferably arranged in the form of a Wheatstone bridge. In this case, the magnetoresistive sensors are arranged on the surface that is passivated by means of a dielectric layer, and are connected by means of electrical conductors to the control and analysis unit implemented in the silicon wafer.

The magnetoresistive sensors can be arranged next to one another or on top of one another or within one another. Preferably, the magnetoresistive sensor unit is arranged inside the first circle in a projection perpendicular to the top surface of the semiconductor layer. Preferably, the sensors have a point of symmetry. It is preferred that the point of symmetry is on the center of the circle.

The first Hall sensors, the second Hall sensors, and the third Hall sensors of the two Hall sensor systems can each enclose the same offset angle with respect to a common center point of the two circles.

The angle of the rotation or of the offset angle of the Hall sensors of the first Hall sensor system can be less than 20° or less than 10° relative to the Hall sensors of the second Hall sensor system.

The three Hall sensors of the two Hall sensor systems each can enclose an angle of 120° relative to one another, which is to say the Hall sensors are distributed evenly along the circular line.

The first Hall sensor of each Hall sensor system can enclose an angle of 90° with the second Hall sensor of the same Hall sensor system, and an angle of 180° with the third Hall sensor of the same Hall sensor system.

Each Hall sensor can be implemented as a Hall plate with at least four terminals.

The two Hall sensor systems can each have a fourth Hall sensor, or each have a fourth Hall sensor and a fifth Hall sensor, or each have a fourth Hall sensor and a fifth Hall sensor and a sixth Hall sensor.

An advantage is that the angular resolution can be increased with the implementation of more than three Hall sensors. In one improvement, each Hall sensor system has a maximum of seven Hall sensors.

Each Hall sensor can have a first main extension surface, wherein the first main extension surface is formed parallel to the top surface of the semiconductor layer. In this case, the first main extension surface has a significantly larger area than the other surfaces of the Hall sensor in question. It is a matter of course that a second main extension surface opposite the first main extension surface is formed parallel to the first main extension surface in every Hall sensor.

At least one z-component of the magnetic field can be measured with the magnetic field sensors, which is to say with the Hall sensors of the Hall sensor systems and any additional types of magnetic field sensor that may be implemented.

In the present case, the z-component can be understood here to mean a vertical component, which is to say a component substantially perpendicular or perpendicular to the top surface of the semiconductor layer or perpendicular to the two main extension surfaces of the relevant Hall sensors.

The first Hall sensor system and the second Hall sensor system have the same number of Hall sensors.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
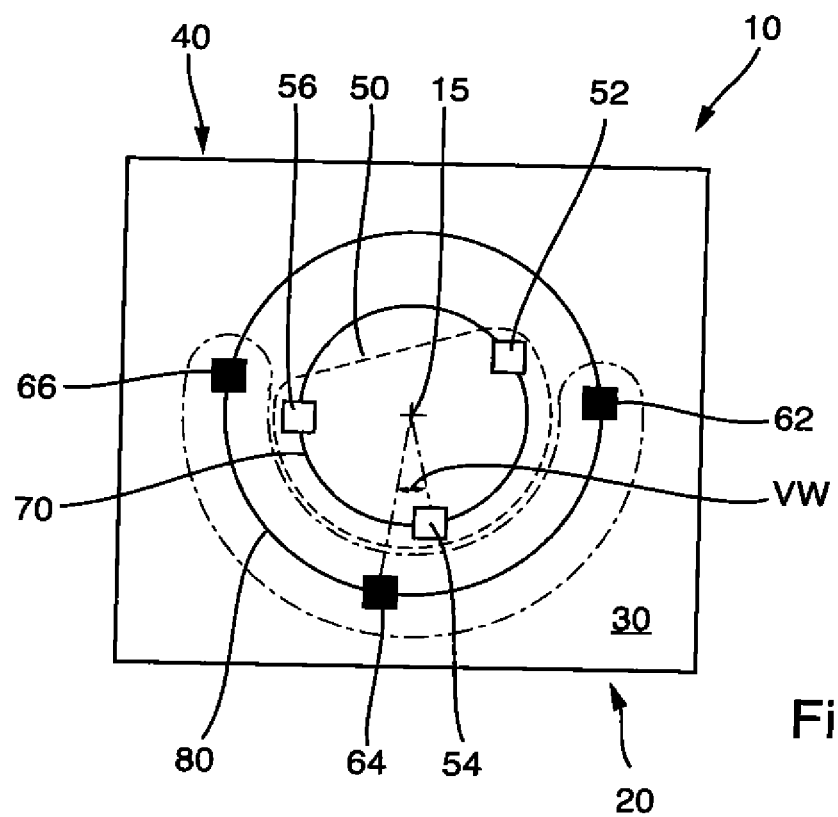
FIG. 1 shows a representation of a first embodiment according to the invention of a rotation-angle measuring unit.

The illustration in FIG. 1 shows a representation of a first embodiment according to the invention of an integrated rotation-angle measuring unit 10.

The rotation-angle sensor unit 10 is part of a measuring system (not shown in detail) for determining the angle of rotation of a shaft. In addition to the shaft that is rotatable about an axis of rotation 15, the measuring system also includes a transmitter arranged on the shaft. In general, the transmitter is implemented as a permanent magnet, and preferably is arranged on the end face of the shaft.

The rotation-angle sensor unit 10 preferably has a semiconductor layer 20 that includes silicon or is made of silicon. The semiconductor layer 20 has a top surface 30 that is implemented perpendicular to the axis of rotation 15 and has a bottom surface 40.

The semiconductor layer 20 is preferably implemented as a silicon wafer. A control and analysis unit that is not shown is implemented in the semiconductor layer 20.

Formed in the semiconductor layer 20 are a monolithically formed first Hall sensor system 50 and a monolithically formed second Hall sensor system 60. The control and analysis circuit is electrically connected to the two Hall sensor systems 50 and 60.

Each Hall sensor system 50 and 60 respectively has at least a first Hall sensor 52 or 62, a second Hall sensor 54 or 64, and a third Hall sensor 56 or 66.

The three Hall sensors 52, 54, and 56 of the first Hall sensor system 50 are arranged on a first circle 70 that is parallel to the top surface 30 of the semiconductor layer 20 and is arranged concentrically around the axis of rotation 15.

The three Hall sensors 62, 64, and 66 of the second Hall sensor system 60 are arranged on a second circle 80 parallel to the top surface 30 of the semiconductor layer 20 and concentrically arranged around the axis of rotation 15. The second circle 80 is arranged to be concentric to the first circle 70.

The first Hall sensor system 50 is designed to be redundant to the second Hall sensor system 60, and preferably measures a magnetic field produced by the transmitter along the axis of rotation 15.

Preferably, the control and analysis unit is arranged inside the first circle 70.

In each of the two Hall sensor systems 50 and 60, the respective three Hall sensors 52, 62, 54, 64, 56, and 66 are designed to be spaced apart along the relevant circular line 70 or 80.

Preferably, the three Hall sensors 52, 62, 54, 64, 56, and 66 of the two Hall sensor systems 50 and 60 each enclose an angle of 120° relative to one another.

The first Hall sensors 52, 62, the second Hall sensors 54, 64, and the third Hall sensors 56 and 66 of the two Hall sensor systems 50 and 60 each enclose the same offset angle VW with respect to a common center point, which is to say with respect to the axis of rotation 15 of the two circles 70 and 80.

Preferably, the Hall sensors 52, 62, 54, 64, 56, and 66 are each implemented as a Hall plate with at least four terminals.

Figure 2:
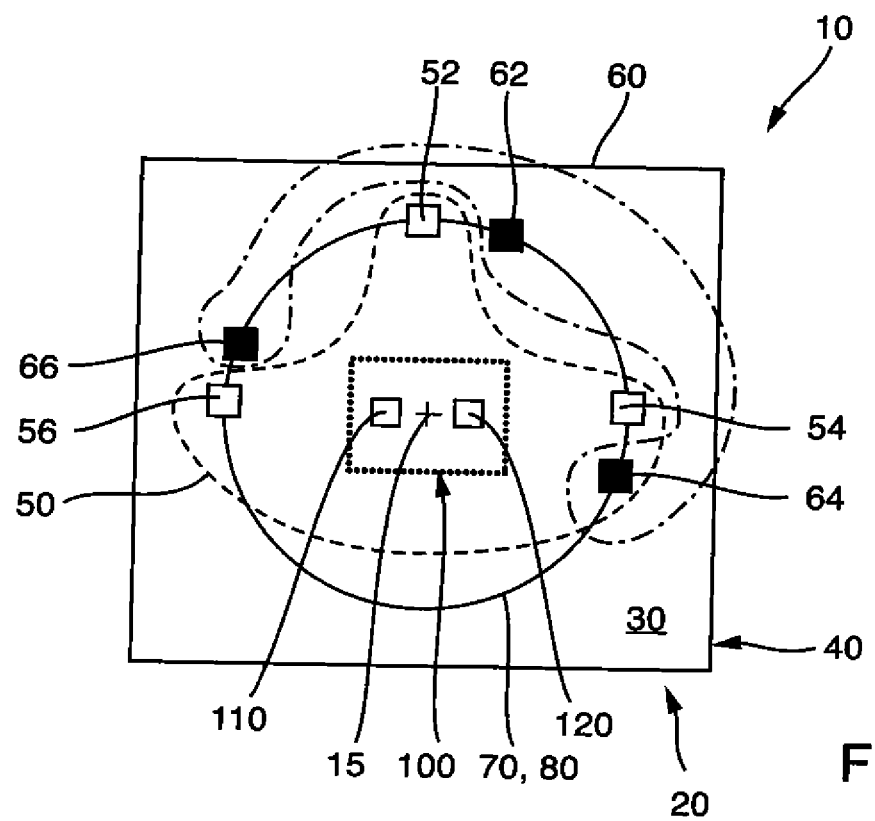
FIG. 2 shows a representation of a second embodiment according to the invention of a rotation-angle measuring unit.

The illustration in FIG. 2 shows a representation of a second embodiment according to the invention of the rotation-angle measuring unit 10. Only the differences from the embodiment shown in conjunction with the illustration in FIG. 1 are explained below.

The second circle 80 now has the same diameter as the first circle 70.

The first Hall sensor 52, 62 of each Hall sensor system 50, 60 encloses an angle of 90° with the second Hall sensor 54, 64 of the same Hall sensor system 50, 60, and an angle of 180° with the third Hall sensor 56, 66 of the same Hall sensor system 50, 60.

The rotation-angle measuring unit 10 has a magnetoresistive sensor unit 100 implemented on the top surface of the semiconductor layer 20 with at least two magnetoresistive sensors 110 and 120.

The magnetoresistive sensors 110 and 120 are arranged next to one another, and are arranged inside the first circle 70 in a projection perpendicular to the top surface 30 of the semiconductor layer 20.

In an embodiment that is not shown, the magnetoresistive sensors 110 and 120 are arranged on top of one another or within one another.

Figure 3:
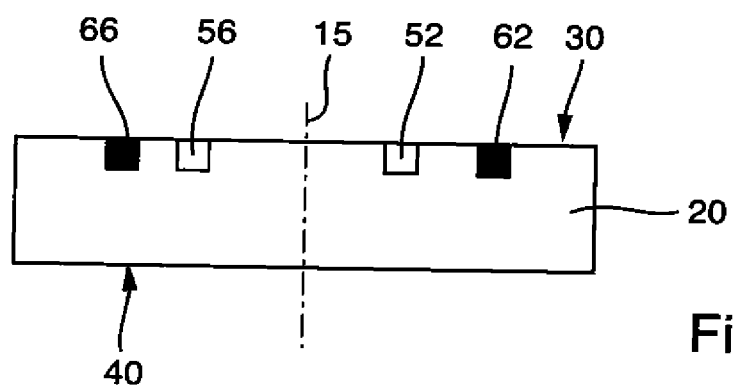
FIG. 3 shows a cross-sectional representation of the rotation-angle measuring unit from FIG. 1 with Hall sensors integrated into the surface.

The illustration in FIG. 3 shows a cross-sectional representation of a first embodiment according to the invention of the rotation-angle measuring unit 10. Only the differences from the embodiment shown in conjunction with the illustration in FIG. 1 are explained below.

The respective first Hall sensors 52, 62 and the respective third Hall sensors 56, 66 are monolithically integrated into the semiconductor layer 20, and are concentrically arranged around the axis of rotation 15.

Figure 4:
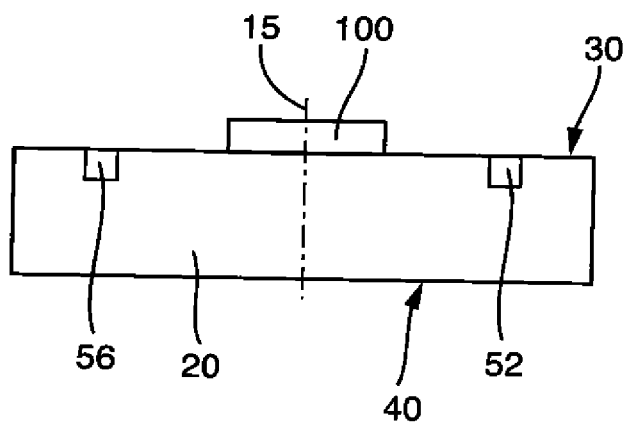
FIG. 4 shows a cross-sectional representation of an embodiment with Hall sensors and magnetoresistive sensors corresponding to the embodiment shown in FIG. 3.

The illustration in FIG. 4 shows a cross-sectional representation of a first embodiment according to the invention of the rotation-angle measuring unit 10. Only the differences from the embodiment shown in conjunction with the illustration in FIG. 2 are explained below.

The magnetoresistive sensor unit 100 is arranged on the top surface 30 of the semiconductor layer 20, wherein the axis of rotation 15 passes through the magnetoresistive sensor unit 100 centrally.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated rotation-angle sensor unit arranged in a measuring system for rotation angle determination, the integrated rotation-angle sensor unit comprising:
    a shaft that is rotatable about an axis of rotation with a transmitter;
    a semiconductor layer with a top surface arranged substantially perpendicular to the axis of rotation and with a bottom surface;
    a first Hall sensor system monolithically formed in the semiconductor layer; and
    a second Hall sensor system monolithically formed in the semiconductor layer,
    wherein each of the first and the second Hall sensor systems comprises at least a first Hall sensor, a second Hall sensor, and a third Hall sensor,
    wherein each of the first, second and third Hall sensors of the first Hall sensor system and the first, second and third Hall sensors of the second Hall sensor system are implemented as separate sensors,
    wherein the first, second and third Hall sensors of the first Hall sensor system are arranged on a first circle that is substantially parallel to the top surface of the semiconductor layer and arranged concentrically around the axis of rotation, and
    wherein the first, second and third Hall sensors of the second Hall sensor system are arranged on a second circle substantially parallel to the top surface of the semiconductor layer and concentric to the first circle.

2. The Integrated rotation-angle sensor unit according to claim 1, wherein the integrated rotation-angle sensor unit comprises, implemented on the top surface of the semiconductor layer, a magnetoresistive sensor unit with at least two magnetoresistive sensors.

3. The Integrated rotation-angle sensor unit according to claim 2, wherein the at least two magnetoresistive sensors are arranged next to one another or on top of one another or within one another.

4. The Integrated rotation-angle sensor unit according to claim 2, wherein the magnetoresistive sensor unit is arranged inside the first circle in a projection substantially perpendicular to the top surface of the semiconductor layer.

5. The Integrated rotation-angle sensor unit according to claim 1, wherein the first Hall sensors, the second Hall sensors, and the third Hall sensors of the first and second Hall sensor systems each enclose the same offset angle with respect to a common center point of the first and second circles.

6. The Integrated rotation-angle sensor unit according to claim 1,
    wherein the first, second, and third Hall sensors of the first Hall sensor system each enclose an angle of 120° relative to one another, and
    wherein the first, second, and third Hall sensors of the second Hall sensor system each enclose an angle of 120° relative to one another.

7. The Integrated rotation-angle sensor unit according to claim 1,
    wherein the first Hall sensor of the first Hall sensor system encloses an angle of 90° with the second Hall sensor of the first Hall sensor system, and an angle of 180° with the third Hall sensor of the first Hall sensor system, and
    wherein the first Hall sensor of the second Hall sensor system encloses an angle of 90° with the second Hall sensor of the second Hall sensor system, and an angle of 180° with the third Hall sensor of the second Hall sensor system.

8. The Integrated rotation-angle sensor unit according to claim 1, wherein the first, second, and/or third Hall sensor of the first and second Hall systems is implemented as a Hall plate with at least four terminals.

9. The Integrated rotation-angle sensor unit according to claim 1, wherein the first and second Hall sensor systems each comprises a fourth Hall sensor, or each comprises a fourth Hall sensor and a fifth Hall sensor, or each comprises a fourth Hall sensor and a fifth Hall sensor and a sixth Hall sensor.

10. The Integrated rotation-angle sensor unit according to claim 1, wherein the first, second, and/or third Hall sensor of the first and second Hall systems comprises a main extension surface, and the main extension surface is formed parallel to the top surface of the semiconductor layer.

11. The Integrated rotation-angle sensor unit according to claim 10, wherein a surface area of the main extension surface of the first Hall sensor of the first Hall sensor system is larger than surface areas of the main extension surfaces of the second and third Hall sensors of the first Hall sensor system, and/or wherein a surface area of the main extension surface of the first Hall sensor of the second Hall sensor system is larger than surface areas of the main extension surfaces of the second and third Hall sensors of the second Hall sensor system.

12. The Integrated rotation-angle sensor unit according to claim 1, wherein the semiconductor layer is a silicon semiconductor layer.

13. The Integrated rotation-angle sensor unit according to claim 1, wherein the first Hall sensor system and the second Hall sensor system have the comprise a same number of Hall sensors.

14. The Integrated rotation-angle sensor unit according to claim 1, wherein the same components are measured of the magnetic field produced by the transmitter.

15. The Integrated rotation-angle sensor unit according to claim 1, wherein the first Hall sensor system comprises a maximum of seven Hall sensors, and/or wherein the second Hall sensor system comprises a maximum of seven Hall sensors.

16. The Integrated rotation-angle sensor unit according to claim 1, wherein at least one z-component of the magnetic field produced by the transmitter is measured by the first and/or the second Hall sensor system, the z-component being a component of the magnetic field that is perpendicular to the top surface of the semiconductor layer.

17. The Integrated rotation-angle sensor unit according to claim 1, wherein the first Hall sensor system is redundant to the second Hall sensor system.

18. An integrated rotation-angle sensor unit arranged in a measuring system for rotation angle determination, the integrated rotation-angle sensor unit comprising:
- a shaft that is rotatable about an axis of rotation with a transmitter;
- a semiconductor layer with a top surface arranged substantially perpendicular to the axis of rotation and with a bottom surface;
- a first Hall sensor system monolithically formed in the semiconductor layer; and
- a second Hall sensor system monolithically formed in the semiconductor layer,
- wherein the first and the second Hall sensor system comprise at least a first Hall sensor, a second Hall sensor, and a third Hall sensor,
- wherein the first, second and third Hall sensors of the first Hall sensor system are arranged on a first circle that is substantially parallel to the top surface of the semiconductor layer and arranged concentrically around the axis of rotation,
- wherein the first, second and third Hall sensors of the second Hall sensor system are arranged on a second circle substantially parallel to the top surface of the semiconductor layer and concentric to the first circle, and
- wherein the first circle and the second circle have a same diameter.

* * * * *